United States Patent
Lee et al.

(10) Patent No.: US 9,230,482 B2
(45) Date of Patent: Jan. 5, 2016

(54) SHIFT REGISTER AND METHOD OF DRIVING THE SAME

(71) Applicant: LG DISPLAY CO., LTD., Seoul (KR)

(72) Inventors: Hyun Haeng Lee, Jung-ri (KR); Hyun Jin Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/079,972

(22) Filed: Nov. 14, 2013

(65) Prior Publication Data

US 2014/0146031 A1    May 29, 2014

(30) Foreign Application Priority Data

Nov. 27, 2012    (KR) .................. 10-2012-0134931

(51) Int. Cl.
  *G09G 3/32*    (2006.01)
  *G11C 19/18*    (2006.01)
  *G11C 19/28*    (2006.01)

(52) U.S. Cl.
  CPC ............ *G09G 3/3291* (2013.01); *G11C 19/184* (2013.01); *G11C 19/28* (2013.01); *G09G 2300/0417* (2013.01)

(58) Field of Classification Search
  None
  See application file for complete search history.

(56) References Cited

U.S. PATENT DOCUMENTS

| 2008/0218502 | A1 | 9/2008 | Lee et al. |
| 2010/0067646 | A1 | 3/2010 | Liu et al. |
| 2011/0069044 | A1 | 3/2011 | Lee et al. |
| 2012/0162206 | A1 | 6/2012 | Nam et al. |
| 2014/0035891 | A1* | 2/2014 | Tanaka .......................... 345/204 |

FOREIGN PATENT DOCUMENTS

| CN | 101261412 A | 9/2008 |
| CN | 101515446 A | 8/2009 |
| CN | 102024437 A | 4/2011 |
| CN | 102760410 A | 10/2012 |
| JP | WO2012157545 | * 11/2012 ............... G09G 3/36 |

OTHER PUBLICATIONS

Office Action dated Jul. 3, 2015 for corresponding Chinese Patent Application No. 201310611589.4, 11 pages.

* cited by examiner

*Primary Examiner* — Stephen Sherman
*Assistant Examiner* — Donna Lui
(74) *Attorney, Agent, or Firm* — Brinks Gilson & Lione

(57) ABSTRACT

A shift register for flat panel display devices includes a start signal unit configured to control a start of an output signal, an end signal unit configured to control an end of the output signal, and a plurality of stages configured to increase the output signal to a high-level driving voltage according to a signal supplied from a first node connected to the start signal unit, and decrease the output signal to a low-level driving voltage according to a signal supplied from a second node connected to the end signal unit. Each of the plurality of stages generates multi signals for diving a pixel circuit of a display device.

19 Claims, 13 Drawing Sheets

< OPERATION IN SECOND SECTION >

SHIFT REGISTER AND METHOD OF DRIVING THE SAME

CROSS-REFERENCE TO RELATED APPLICATIONS

This application claims the benefit of priority to Korean Patent Application No. 10-2012-0134931 filed on Nov. 27, 2012, which is hereby incorporated by reference as if fully set forth herein.

BACKGROUND

1. Field of the Disclosure

The present disclosure relates to a display device, and particularly, to a shift register for flat panel display devices and a method of driving the same.

2. Discussion of the Related Art

With the advance of various portable electronic devices such as mobile terminals and notebook computers, the demand for flat panel display devices applied to the portable electronic devices is increasing. Therefore, flat panel display devices such as liquid crystal display (LCD) devices, plasma display panel (PDP) devices, and organic light emitting diode (OLED) display devices are being commercialized.

A gate driving circuit of the flat panel display devices includes a shift register for sequentially supplying a gate pulse to a plurality of gate lines. The shift register includes a plurality of stages including a plurality of transistors, and the stages are connected in cascade to sequentially output the gate pulse.

Recently, LCD devices and/or organic light emitting display devices use a gate-in panel (GIP) type in which the transistors configuring the shift register of the gate driving circuit are built into a substrate of a display panel as thin film transistors (TFTs).

The TFTs configuring the GIP type shift register supply the gate pulse to a plurality of pixels formed in the display panel, respectively. Therefore, in addition to fundamental characteristics of the TFTs such as a mobility and a leakage current, an electrical reliability and a durability for maintaining a service life for a long time are very important.

A semiconductor layer of the TFTs is formed of amorphous silicon or polycrystalline silicon. Amorphous silicon is simple in film-forming process and is low in manufacturing cost, but cannot secure an electrical reliability.

Moreover, polycrystalline silicon is very difficult to realize a large area due to a high process temperature, and cannot secure a uniformity based on a crystallization scheme. To solve such problems, research for using an oxide semiconductor as the semiconductor layer of the TFTs is being done recently.

An oxide semiconductor is amorphous, and is evaluated as a stable material. When using the oxide semiconductor as the semiconductor layer of the TFTs, the TFTs can be manufactured at a low temperature by using the existing process equipment even without additionally buying separate process equipment, and there are several advantages such as an ion injecting process being omitted, etc.

FIG. 1 is a graph showing a transfer characteristic of a general oxide TFT.

As seen in FIG. 1, since an oxide thin film transistor (hereinafter referred to as an oxide TFT) has a negative threshold voltage, a leakage current occurs when a gate voltage (Vg) is 0 V. Due to the leakage current, the shift register cannot output a normal gate pulse.

Such a problem can be solved by changing a manufacturing process of the oxide TFT to shift a threshold voltage of the oxide TFT to a positive voltage. However, since the TFTs formed in a display area of the display panel also have a positive threshold voltage (Vth), driving power increases. Therefore, a method is needed for lessening an influence of the threshold voltage corresponding to a weak point of the oxide TFT configuring the shift register.

The shift register includes a pull-up TFT for outputting a high voltage and a pull-down TFT for outputting a low voltage. Here, the pull-up TFT for outputting the high voltage is connected to a Q node, and the pull-down TFT for outputting the low voltage is connected to a QB node.

Here, the QB node holds the high voltage for most of time during one frame period. Accordingly, a threshold voltage of the pull-down TFT connected to the QB node is shifted to a positive voltage, and for this reason, a falling time operation is affected.

In the GIPT type shift register of the related art, when a layout for driving in one horizontal period (1HT) is set, it is difficult to change a timing of an output signal.

Especially, when a layout is set as a 1HT driving scheme, a signal cannot be outputted for a time equal to or longer than one horizontal period (1HT), and when a layout is set as a 2HT driving scheme, an output of a signal is inevitably adjusted in only a 2HT time corresponding to two horizontal period (2HT).

Since the related art shift register generates an output signal (VGH, VGL) by booting a clock signal (CLK), the output signal is affected by a width of the clock signal (CLK). It is required to increase the width of the clock signal for increasing an output time of a signal, but when the width of the clock signal increases, the shift register cannot normally operate because a high output signal (VGH) and a low output signal (VGL) overlaps.

In addition, multi signals, namely, various output signals, are needed for driving pixels of the OLED display device. However, the related art shift register cannot generate various output signals, and cannot adjust a timing of the output signals.

SUMMARY

A shift register includes: a start signal unit configured to control a start of an output signal by using a first start pulse signal, a first clock signal, and a first control pulse signal which are inputted thereto; an end signal unit configured to control an end of the output signal by using a second start pulse signal, a second clock signal, and a second control pulse signal which are inputted thereto; and a plurality of stages configured to increase the output signal to a high-level driving voltage according to a signal supplied from a first node connected to the start signal unit, and decrease the output signal to a low-level driving voltage according to a signal supplied from a second node connected to the end signal unit, each of the plurality of stages generating multi signals for diving a pixel circuit of a display device.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE EXEMPLARY EMBODIMENTS

Figure 1:
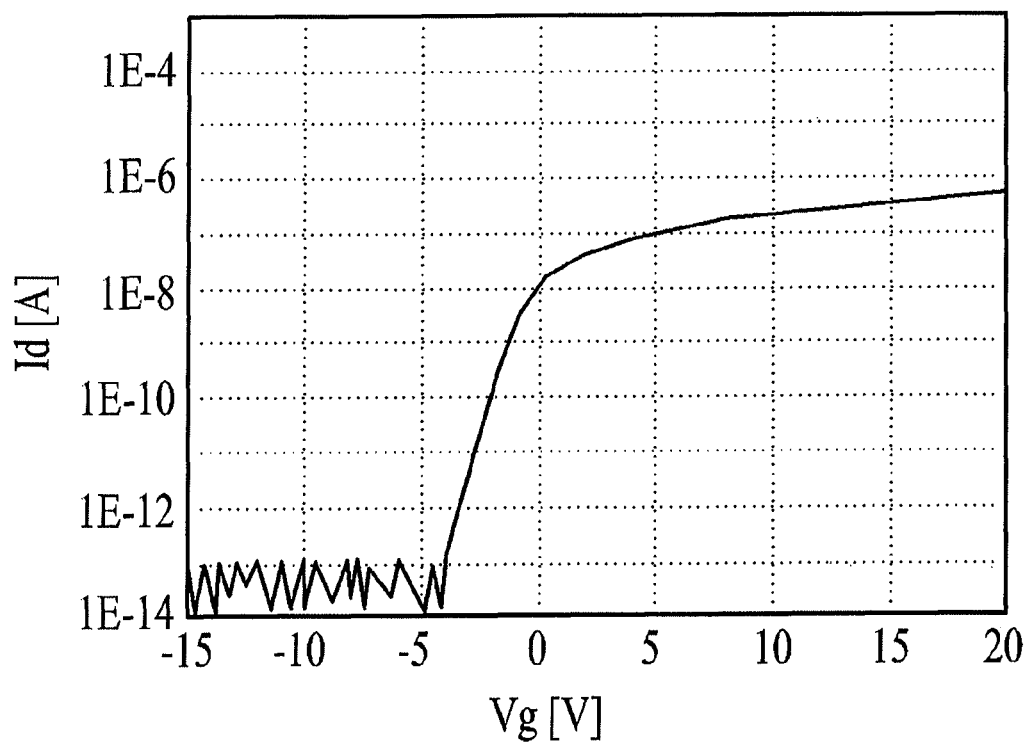
FIG. 1 is a graph showing a transfer characteristic of a general oxide TFT.
Figure 2:
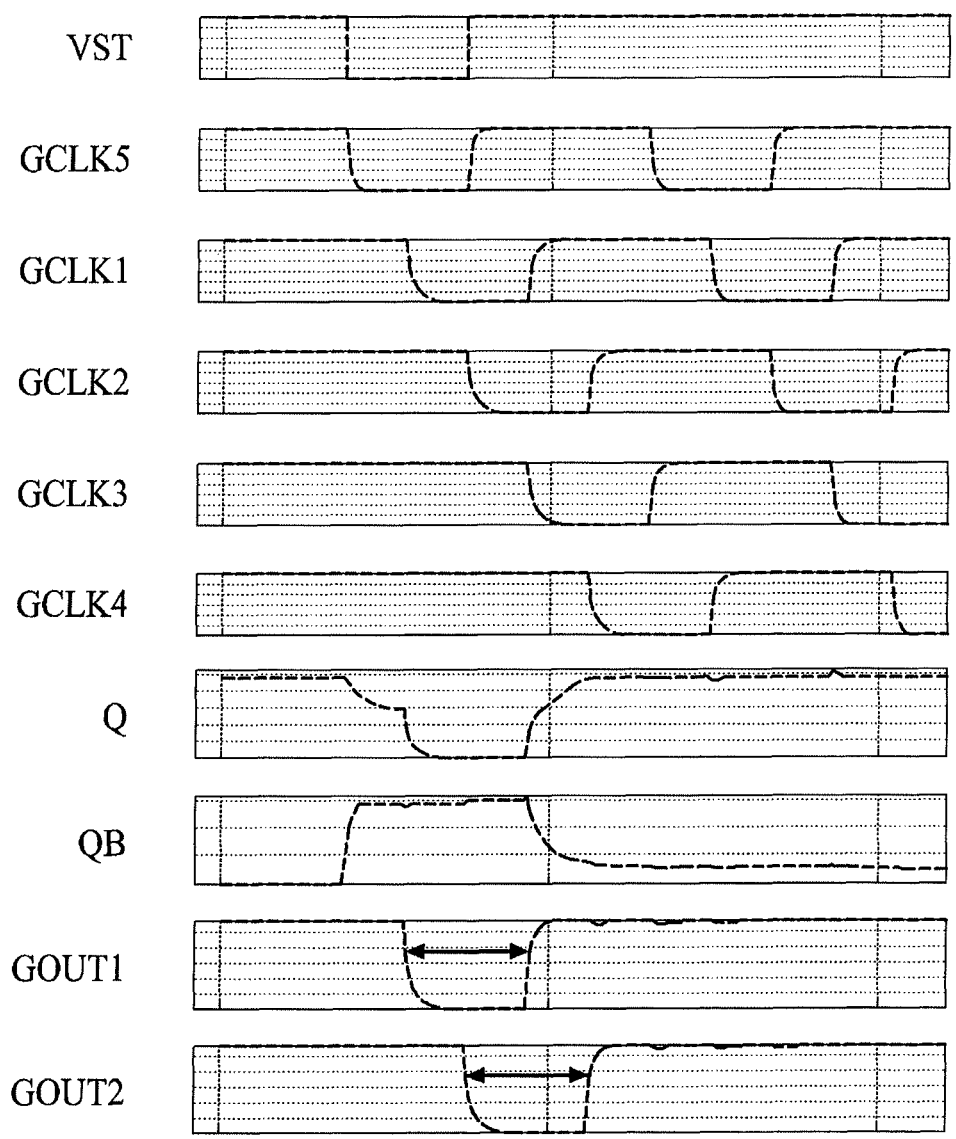
FIG. 2 is a diagram showing a driving timing of a related art shift register.

In the specification, in adding reference numerals for elements in each drawing, it should be noted that like reference numerals already used to denote like elements in other drawings are used for elements wherever possible.

The terms described in the specification should be understood as follows. As used herein, the singular forms "a", "an" and "the" are intended to include the plural forms as well, unless the context clearly indicates otherwise. The terms "first" and "second" are for differentiating one element from the other element, and these elements should not be limited by these terms.

It will be further understood that the terms "comprises", "comprising,", "has", "having", "includes" and/or "including", when used herein, specify the presence of stated features, integers, steps, operations, elements, and/or components, but do not preclude the presence or addition of one or more other features, integers, steps, operations, elements, components, and/or groups thereof.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Hereinafter, a shift register and a flat panel display device including the same according to embodiments of the present invention will be described in detail with reference to the accompanying drawings.

Figure 3:
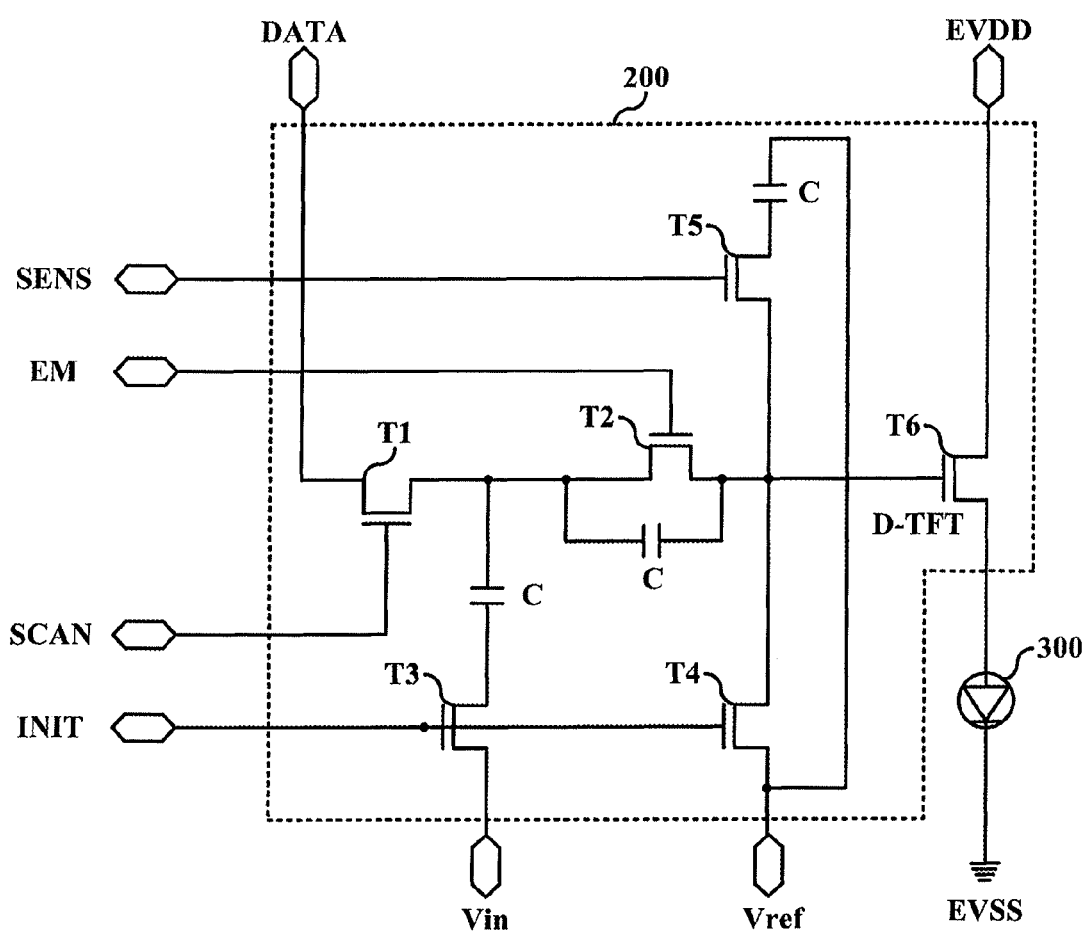
FIG. 3 is a diagram illustrating one pixel formed in an OLED display device according to an embodiment of the present invention.

FIG. 3 is a diagram illustrating one pixel formed in an OLED display device according to an embodiment of the present invention.

Referring to FIG. 3, each of a plurality of pixels formed in a display panel includes an organic light emitting diode (OLED) 300 and a pixel circuit 200 for driving the OLED 300.

The pixel circuit provided in each pixel includes a plurality of thin film transistors (TFTs) T1 to T5, a driving TFT D-TFT, and a capacitor C.

Each pixel includes a data line for supplying a data voltage to the pixel circuit 200, a scan line for supplying a scan signal, an emission signal line (EM line) for supplying an emission signal, a driving voltage line (EVDD line, EVSS line) for supplying a driving voltage, an initialization signal line (INIT line) receiving an initialization signal, and a reference voltage line (Vref line) for supplying a reference voltage.

In the pixel circuit 200 of FIG. 3, when the scan signal SCAN is supplied to a first TFT T1 and the emission signal EM is supplied to a second TFT T2, the driving TFT D-TFT is turned on, and a driving voltage EVDD is applied to the OLED 300 through the driving voltage line according to the turn-on of the driving TFT D-TFT, thereby emitting light.

The pixel circuit 200 of the OLED display device having the above-described configuration needs multi signals such as the scan signal SCAN, the emission signal EM, the initialization signal INT, etc., depending on a plurality of driving sections.

To describe the emission signal EM as an example, during one frame period, a first high signal of the emission signal EM is used as a signal for initializing a gate node of the driving TFT D-TFT, and then a second high signal of the emission signal EM is used as a signal for actually emitting light from the driving TFT D-TFT.

The emission signal EM applied through the same emission signal line may be differently used depending on the driving sections. Especially, the first high signal of the emission signal EM is the signal for initializing the gate node of the driving TFT D-TFT, and may be short in output time for which the first high signal is outputted.

On the other hand, the second high signal of the emission signal EM is the signal for actually emitting light from the driving TFT D-TFT, and needs to secure a sufficient output time for which the second high signal is outputted. Also, only when a time for which the emission signal EM is outputted is freely adjusted, a time for which the OLED 300 emits light can be freely adjusted.

Figure 4:
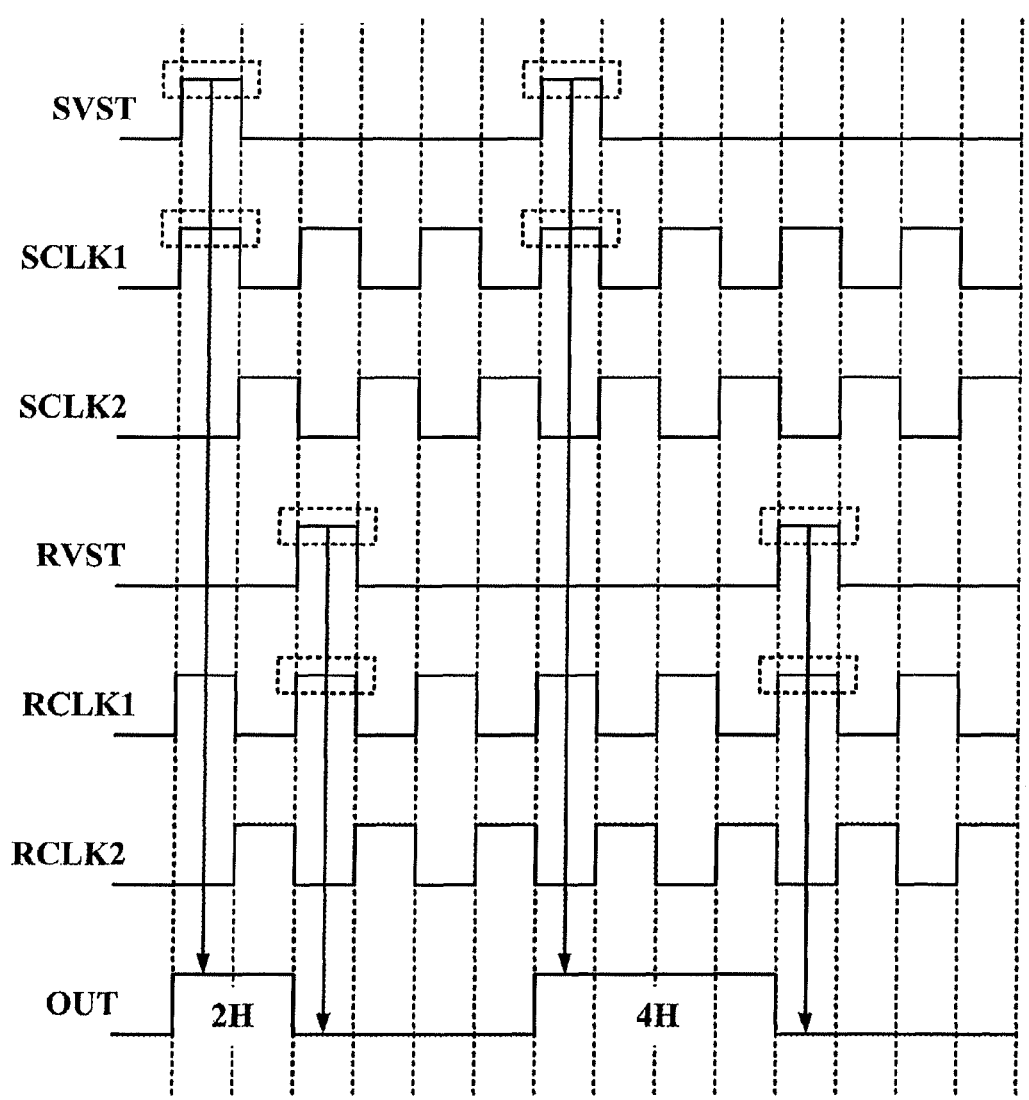
FIG. 4 is a diagram showing timings of signals outputted from a shift register according to an embodiment of the present invention.

FIG. 4 is a diagram showing timings of signals outputted from a shift register according to an embodiment of the present invention.

As shown in FIG. 4, when an output signal OUT of the shift register is the emission signal EM, the first high signal of the emission signal EM may be outputted during two horizontal period (2H) to initialize the gate node of the driving TFT D-TFT, and the second high signal of the emission signal EM may be outputted during four horizontal period (4H) to emit light from the gate node of the driving TFT D-TFT.

As shown in FIG. 4, the shift register 100 according to an embodiment of the present invention uses two start pulse signals SVST and RVST for generating the multi signals.

Here, a first start pulse signal SVST is a start pulse signal that allows the output signal to start to rise, and a second start pulse signal RVST is a start pulse signal that allows the output signal to start to fall. That is, the first start pulse signal SVST is used as a start signal of the output signal, and the second start pulse signal RVST is used as an end signal of the output signal.

Figure 6:
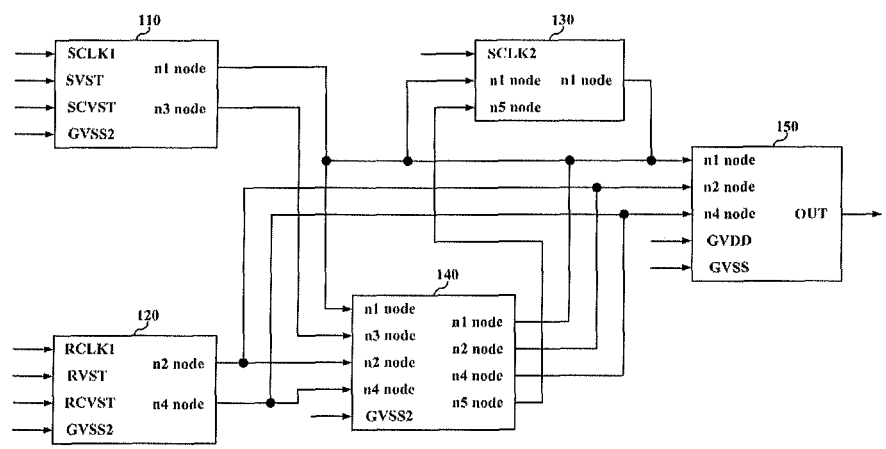
FIG. 6 is a diagram illustrating a plurality of functional blocks configuring the shift register according to an embodiment of the present invention illustrated in FIG. 5.

The shift register 100 according to an embodiment of the present invention uses two control pulse signals SCVST and RCVST illustrated in FIG. 6, for preventing a shift of a threshold voltage (Vth) of a TFT (for example, a pull-down TFT) connected to an output terminal OUT.

The shift register 100 allows the output signal to be started by using the first start pulse signal SVST and clock signals SCLK1 and SCLK2. Also, the shift register 100 allows the output signal to be ended by using the second start pulse signal RVST and clock signals RCLK1 and RCLK2.

In this case, the clock signals SCLK1 and SCLK2 are used to generate a high output signal of a first node (a Q node), and the clock signal RCLK2 is used to generate a low output signal of a second node (a QB node).

In order to generate the multi signals, after the second start pulse signal RVST is ended, the shift register 100 has a certain delay time, and then again generates the first start pulse signal SVST. Subsequently, when the second start pulse signal RVST is again applied, it becomes possible to generate the multi signals. In addition, the pull-down TFT may be designed as a dual TFT, namely, may be configured with a first pull-down TFT and a second pull-down TFT, and thus, an operating characteristic of a falling time can be secured.

Figure 5:
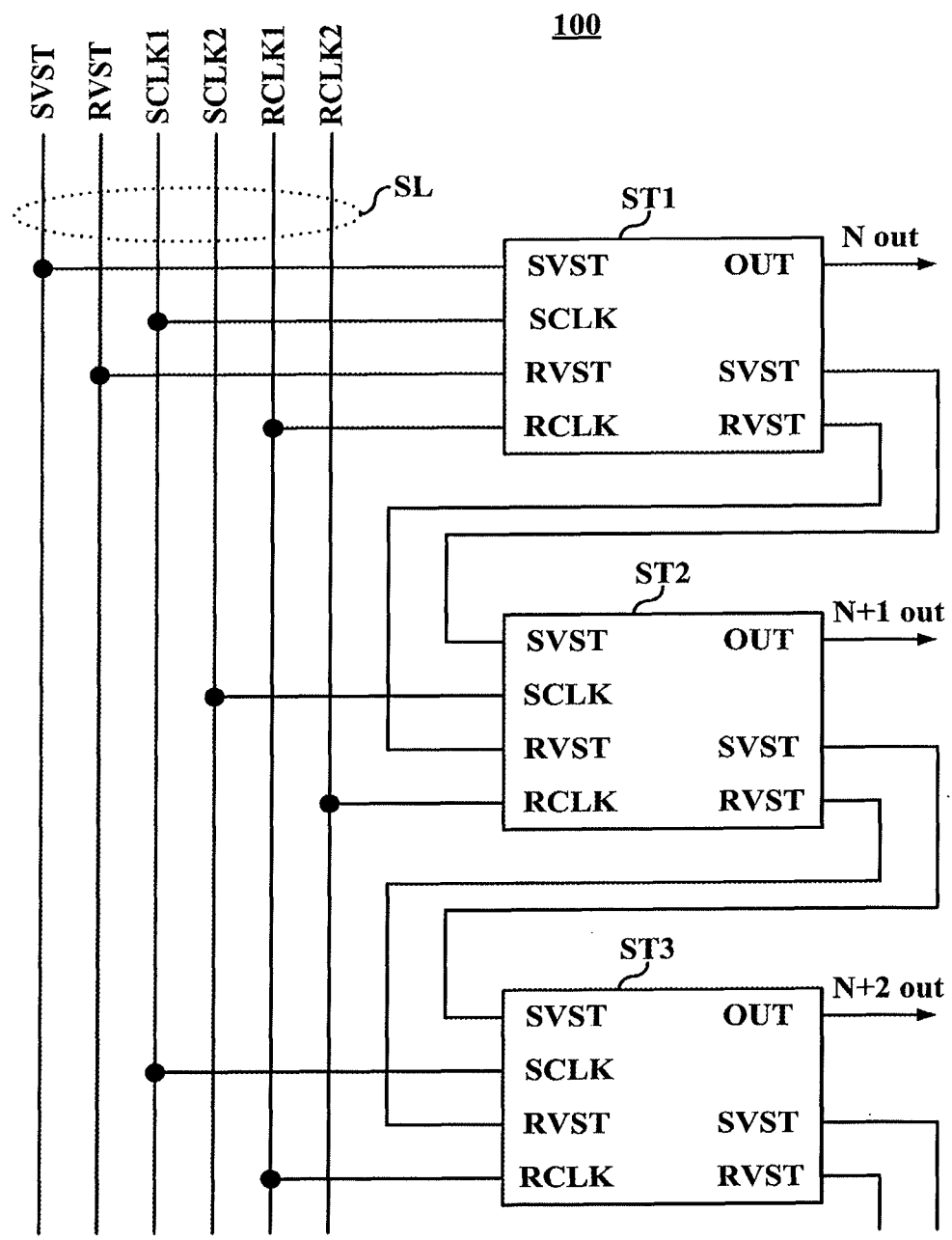
FIG. 5 is a block diagram schematically illustrating a shift register according to an embodiment of the present invention.

FIG. 5 is a block diagram schematically illustrating the shift register according to an embodiment of the present invention. FIG. 6 is a diagram illustrating a plurality of functional blocks configuring the shift register according to an embodiment of the present invention illustrated in FIG. 5.

Referring to FIG. 5, the shift register 100 according to an embodiment of the present invention includes m number of stages ST1 to STm that are selectively connected to a plurality of signal supply lines SL receiving the plurality of clock signals SCLK1, SCLK2, RCLK1 and RCLK2, and driven according to the plurality of start pulse signals SVST and RVST. FIG. 5 illustrates only three stages among the m stages.

The plurality of start pulse signals SVST and RVST and the plurality of clock signals SCLK1, SCLK2, RCLK1 and RCLK2, which are inputted to the shift register 100, are inputted from a timing controller that controls driving of the display panel.

To provide a detailed description, the start pulse signal SVST is supplied to a first stage ST1. Each of second to mth stages ST2 to STm receives an output signal of a previous stage (for example, one of ST1 to ST(m−1)) as the start pulse signal SVST.

Similarly to the start pulse signal SVST, the end pulse signal RVST is supplied to the first stage ST1. Each of the second to mth stages ST2 to STm receives the end pulse signal RVST of a previous stage (for example, one of ST1 to ST(m−1)).

Each of the m stages ST1 to STm receives only two of the plurality of clock signals SCLK1, SCLK2, RCLK1 and RCLK2 whose respective phases are sequentially delayed for a time corresponding to ½ clock or one clock.

For example, when the clock signals SCLK1 and RCLK1 are inputted to the first stage ST1, the clock signals SCLK2 and RCLK2 are sequentially phase-delayed for a time corresponding to ½ clock or one clock, and inputted to the second stage ST2. In this way, two clock signals are sequentially phase-delayed for a time corresponding to ½ clock or one clock, and sequentially inputted to the third to mth stages ST3 to STm.

Each of the m stages ST1 to STm is connected to a high-level driving voltage GVDD supply line, a low-level driving voltage GVSS supply line, and a bias voltage (Vtg) supply line. Furthermore, output lines of the m stages ST1 to ST are connected to m number of gate lines GL1 to GLm formed in a display area of a flat panel display device (not shown), respectively.

The m stages ST1 to STm start to drive according to the start pulse signal SVST, and output respective output signals Vout whose phases having a gate-on voltage level are sequentially delayed for a time corresponding to a ½ horizontal period or one horizontal period according to two clock signals SCLK1 and RCLK1 or SCLK2 and RCLK2. The sequentially delayed output signals are sequentially supplied to the plurality of gate lines GL1 to GLm. In this case, a width of m number of output signals, namely, a holding time for which each of the output signals is held, may be a time corresponding to three horizontal period (3H) or more as well as one horizontal period (1H) or two horizontal period (2H).

Therefore, a gate-on voltage level of gate pulse is supplied to the plurality of gate lines GL1 to GLm during a certain horizontal period, and after the certain horizontal period, a gate-off voltage level of first low-level driving voltage GVSS is supplied to the plurality of gate lines GL1 to GLm.

A plurality of functional blocks (units) configuring the shift register 100 will now be described with reference to FIG. 6.

Each of the plurality of stages configuring the shift register 100 according to an embodiment of the present invention includes a start signal unit 110, an end signal unit 120, a boosting unit 130, a setting unit 140, and a buffer unit 150.

The start signal unit 110 may be configured with a plurality of TFTs and one capacitor. The start signal unit 110 may cause the output signal to rise by using the start pulse signal SVST and the clock signal SCLK1, and shift a signal of each of a first node (a Q node) and third node (a QQ node) through which a high signal is outputted.

The end signal unit 120 may be configured with a plurality of TFTs and one capacitor. The end signal unit 120 may cause the output signal to fall, and shift a signal of each of a second node (a QB node) and fourth node (a QBB node) through which a low signal is outputted.

The boosting unit 130 may be configured with a plurality of TFTs and one capacitor, and boosts the output signal of the first node (the Q node) by using the clock signal SCLK2.

The setting unit 140 may be configured with a plurality of TFTs. The setting unit 140 outputs a signal such that the first node (the Q node) or the third node (the QQ node) has a high voltage, and outputs a signal such that the second node (the QB node) or the fourth node (the QBB node) has a low voltage.

Alternatively, the setting unit 140 outputs a signal such that the second node (the QB node) or the fourth node (the QBB node) has a high voltage, and outputs a signal such that the first node (the Q node) or the third node (the QQ node) has a low voltage.

The buffer unit 150 may be configured with a plurality of TFTs. The buffer unit 150 causes an output signal of a pull-up TFT connected to the first node (the Q node) to rise, and causes an output signal of a pull-down TFT connected to the second node (the QB node) to fall.

At this time, the pull-down TFT holds a high voltage for most of time during one frame period. In the present invention, the pull-down TFT may be designed as a dual TFT, namely, may be configured with a first pull-down TFT and a second pull-down TFT. The pull-down TFT reduces a stress applied thereto, and prevents a threshold voltage of the pull-down TFT from being shifted to a positive voltage.

In this case, a high-level driving voltage GVDD and a first low-level driving voltage GVSS are applied to the buffer unit 150, and a second low-level driving voltage GVSS2 is applied to the start signal unit 110, the end signal unit 120, and the setting unit 140. Here, the high-level driving voltage GVDD may be +15 to +25 V, and the first low-level driving voltage GVSS and the second low-level driving voltage GVSS2 may be 0 to 10 V. The first low-level driving voltage GVSS and the second low-level driving voltage GVSS2 may have the same voltage level or different voltage levels.

Hereinafter, an example of a circuit configuration of each of the plurality of stages configuring the shift register will be described with reference to FIG. 7, and a method of driving the plurality of stages based on a circuit of FIG. 7 will be described with reference to FIGS. 8 to 13.

Figure 7:
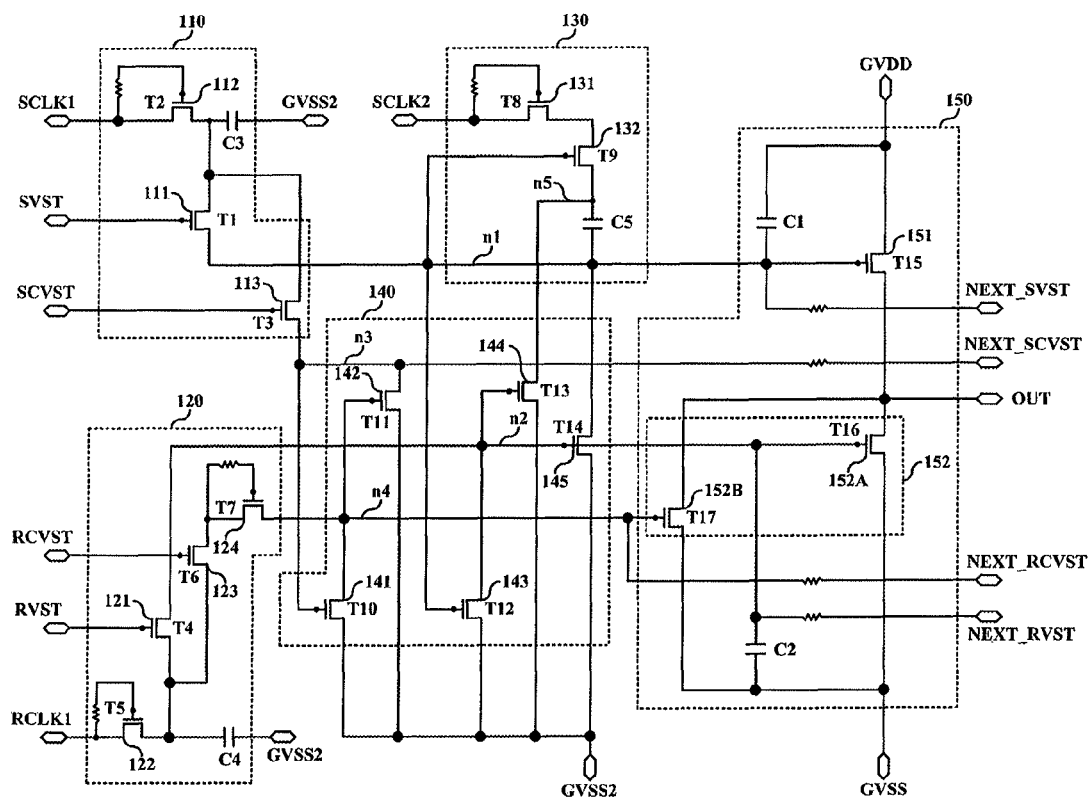
FIG. 7 is a diagram illustrating one stage circuit among a plurality of stages configuring the shift register according to an embodiment of the present invention.
Figure 8:
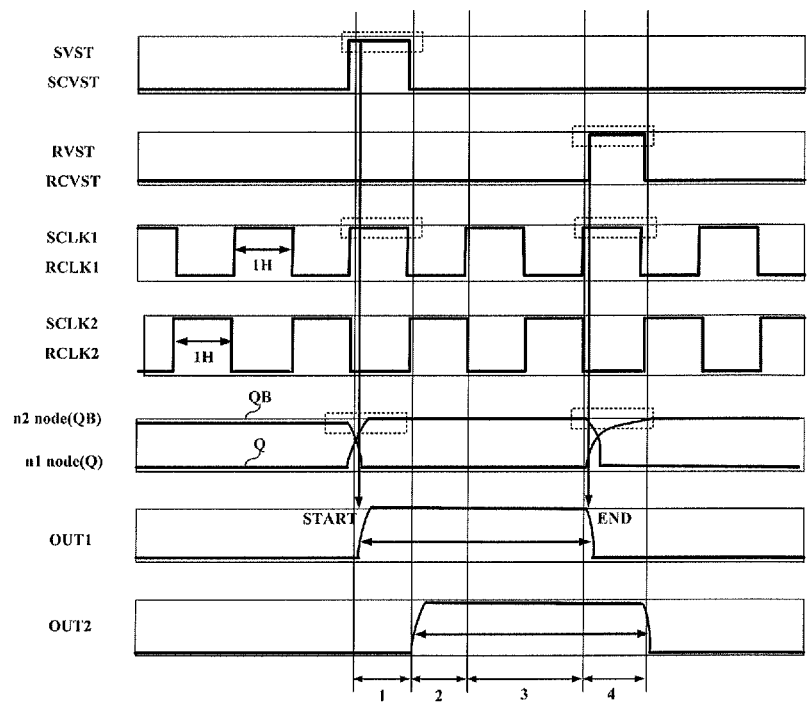
FIGS. 8 and 9 are diagrams showing a driving timing of the shift register according to an embodiment of the present invention.
Figure 9:
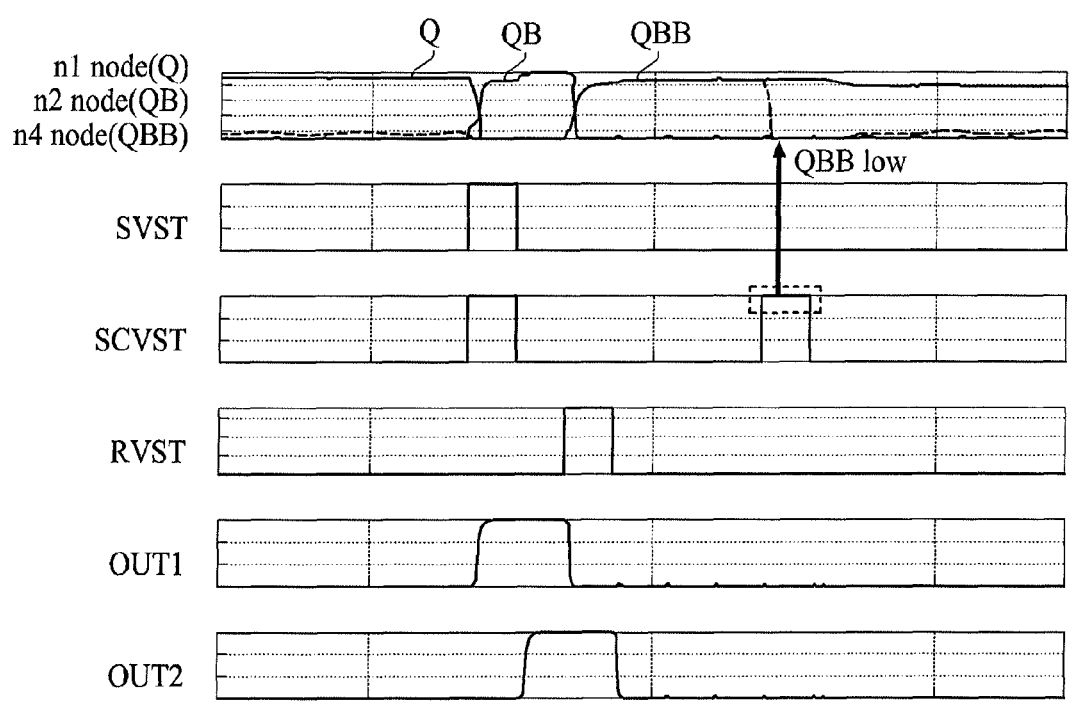

FIG. 7 is a diagram illustrating one stage circuit among the plurality of stages configuring the shift register according to an embodiment of the present invention. FIGS. 8 and 9 are diagrams showing a driving timing of the shift register according to an embodiment of the present invention.

Referring to FIG. 7, the start signal unit 110 includes a third capacitor C3 and first to third switching TFTs 111 to 113 for controlling a voltage of each of the first node (the Q node) n1 and third node (the QQ node) n3 according to the first start pulse signal SVST, a first control pulse signal SCVST, the first clock signal SCLK1, and the second low-level driving voltage GVSS2.

Referring to FIG. 8, the first clock signal SCLK1 has a clock type in which a ground voltage and the gate-on voltage level corresponding to one horizontal period (1H) are alternately repeated, and has the same phase as the first start pulse signal SVST.

The first to third switching TFTs 111 to 113 include an N-type semiconductor layer formed of oxide, and have a negative threshold voltage.

The second switching TFT (T2) 112 of the start signal unit 110 has a diode-connection, and supplies the first clock signal SCLK1 inputted thereto to a source of the first switching TFT (T1) 111.

The first switching TFT (T1) 111 of the start signal unit 110 has a gate connected to a line receiving the first start pulse signal SVST, a source connected to a drain of the second switching TFT (T2) 112, and a drain connected to the first node (the Q node) n1.

The first switching TFT (T1) 111 is turned on according to the first start pulse signal SVST inputted to the gate to supply the first clock signal SCLK1 to the first node (the Q node) n1.

The third switching TFT (T3) 113 of the start signal unit 110 has a gate connected to a line receiving the first control pulse signal SCVST, a source connected between the drain of the second switching TFT (T2) 112 and the source of the first switching TFT (T1) 111, and a drain connected to the third node (the QQ node) n3.

The third switching TFT (T3) 113 is turned on according to the first control pulse signal SCVST inputted to the gate to supply the first clock signal SCLK1 to the third node (the QQ node) n3.

The first switching TFT (T1) 111 of the start signal unit 110 is turned on only when the gate-on voltage level of first start pulse signal SVST is supplied thereto, and outputs the gate-on voltage level of first clock signal SCLK1 to the first node (the Q node) n1.

The third switching TFT (T3) 113 of the start signal unit 110 is turned on only when the gate-on voltage level of first control pulse signal SCVST is supplied thereto, and outputs the gate-on voltage level of first clock signal SCLK1 to the third node (the QQ node) n3.

The end signal unit 120 includes a fourth capacitor C4 and fourth to seventh switching TFTs 121 to 124 for controlling a voltage of each of the second node (the QB node) n2 and fourth node (the QBB node) n4 according to the second start pulse signal RVST, a second control pulse signal RCVST, the second clock signal RCLK1, and the second low-level driving voltage GVSS2.

The fourth to seventh switching TFTs 121 to 124 include an N-type semiconductor layer formed of oxide, and have a negative threshold voltage.

The fifth switching TFT (T5) 122 of the end signal unit 120 has a diode-connection, and supplies the second clock signal RCLK1 inputted thereto to a source of the fourth switching TFT (T4) 121.

The fourth switching TFT (T4) 121 of the end signal unit 120 has a gate connected to a line receiving the second start pulse signal RVST, a source connected to a drain of the fifth switching TFT (T5) 122, and a drain connected to the second node (the QB node) n2.

The fourth switching TFT (T4) 121 is turned on according to the second start pulse signal RVST inputted to the gate. When the fourth switching TFT (T4) 121 is turned on, the fourth switching TFT (T4) 121 supplies the second clock signal RCLK1 to the second node (the QB node) n2.

The sixth switching TFT (T6) 123 of the end signal unit 120 has a gate connected to a line receiving the second control pulse signal RCVST, a source connected between the drain of the fifth switching TFT (T5) 122 and the source of the fourth switching TFT (T4) 121, and a drain connected to the fourth node (the QBB node) n4.

Here, the seventh switching TFT (T7) 124 is diode-connected to the drain of the sixth switching TFT (T6) 123 and the fourth node (the QBB node) n4 to form a diode. Since the seventh switching TFT (T7) 124 is diode-connected, the second clock signal RCLK1 is supplied to the fourth switching TFT (T4) 121 when the sixth switching TFT (T6) 123 is turned on.

The fourth switching TFT (T4) 121 of the end signal unit 120 is turned on only when the gate-on voltage level of second start pulse signal RVST is supplied thereto, and outputs the gate-on voltage level of second clock signal RCLK1 to the second node (the QB node) n2.

The sixth switching TFT (T6) 123 of the end signal unit 120 is turned on only when the gate-on voltage level of second control pulse signal RCVST is supplied thereto, and outputs the gate-on voltage level of second clock signal SCLK1 to the fourth node (the QBB node) n4.

Here, the second clock signal RCLK1 has the same phase as the first clock signal SCLK1, but is not limited thereto. The second clock signal RCLK1 may have a phase which is more delayed for a time corresponding to one horizontal period (1H) or two horizontal period (2H) than the first clock signal SCLK1.

The boosting unit 130 includes an eighth switching TFT (T8) 131, a ninth switching TFT (T9) 132, and a fifth capacitor C5 for boosting the first node (the Q node) n1 by using the third clock signal SCLK2 such that the first node (the Q node) n1 holds a high level. The fifth capacitor C5 is connected between an output terminal (a drain) of the ninth switching TFT (T9) 132 and the first node (the Q node) n1.

The eighth switching TFT (T8) 131 has a diode-connection, and supplies the third clock signal SCLK2 inputted thereto to a source of the ninth switching TFT (T9) 132.

The ninth switching TFT (T9) 132 has a gate connected to the first node (the Q node) n1 and a drain connected to a fifth node n5 disposed between the fifth capacitor C5 and the first node (the Q node) n1.

The eighth switching TFT (T8) 131 and the ninth switching TFT (T9) 132 include an N-type semiconductor layer formed of oxide, and as described above, have a negative threshold voltage.

The third clock signal SCLK2 supplied to the boosting unit 130 may have a phase which is more delayed for a time corresponding to one horizontal period (1H) or two horizontal period (2H) than the first clock signal SCLK1. Only when the third clock signal SCLK2 is supplied, the eighth switching TFT (T8) 131 is turned on, and boosts the first node (the Q node) n1 in order for the first node (the Q node) n1 to hold a high level.

The setting unit 140 includes tenth to fourteenth switching TFTs 141 to 145 for controlling a voltage of each of the first node (the Q node) n1 to fourth node (the QBB node) n4 according to the second start pulse signal RVST, the second control pulse signal RCVST, the first clock signal SCLK1, the second clock signal RCLK, and the second low-level driving voltage GVSS2. The tenth to fourteenth switching TFTs 141 to 145 include an N-type semiconductor layer formed of oxide, and as described above, have a negative threshold voltage.

The tenth switching TFT (T10) 141 has a source connected to a supply line through which the second low-level driving voltage GVSS2 is supplied and a drain connected to the fourth node (the QBB node) n4.

The eleventh switching TFT (T11) 142 has a gate connected to the second node (the QB node) n2, a source connected to the supply line through which the second low-level driving voltage GVSS2 is supplied, and a drain connected to the third node (the QQ node) n3.

The tenth switching TFT (T10) 141 is turned on according to the first clock signal SCLK1 inputted to the gate to supply the second low-level driving voltage GVSS2 to the gate of the eleventh switching TFT (T11) 142.

The tenth switching TFT (T10) 141 and the eleventh switching TFT (T11) 142 are turned on by the first clock signal SCLK1 inputted to the gate to supply the second low-level driving voltage GVSS2 to the third node (the QQ node) n3.

The twelfth switching TFT (T12) 143 has a gate connected to the first node (the Q node) n1, a source connected to the supply line through which the second low-level driving voltage GVSS2 is supplied, and a drain connected to the second node (the QB node) n2.

The thirteenth switching TFT (T13) 144 has a gate connected to the second node (the QB node) n2, a source connected to the supply line through which the second low-level driving voltage GVSS2 is supplied, and a drain connected to the fifth node n5. Here, the fifth node n5 is connected between the ninth switching TFT (T9) 132 and fifth capacitor C5 of the boosting unit 130.

The fourteenth switching TFT (T14) 145 has a gate connected to the second node (the QB node) n2, a source connected to the supply line through which the second low-level driving voltage GVSS2 is supplied, and a drain connected to the first node (the Q node) n1.

The twelfth switching TFT (T12) 143 is turned on according to the first clock signal SCLK1 inputted to the gate to supply the second low-level driving voltage GVSS2 to the gate of the thirteenth switching TFT (T13) 144. The twelfth switching TFT (T12) 143 is turned on according to the first clock signal SCLK1 to supply the second low-level driving voltage GVSS2 to the second node (the QB node) n2.

The fourteenth switching TFT (T14) 145 is turned on according to the second clock signal RCLK1 inputted to the gate to supply the second low-level driving voltage GVSS2 to the buffer unit 150.

The setting unit 140 having the above-described configuration outputs a signal in order for the first node (the Q node) n1 or the third node (the QQ node) n3 to have a high voltage, and outputs a signal in order for the second node (the QB node) n2 or the fourth node (the QBB node) n4 to have a low voltage, according to the second start pulse signal RVST, the second control pulse signal RCVST, the first clock signal SCLK1, and the second clock signal RCLK1.

Alternatively, the setting unit 140 outputs a signal in order for the second node (the QB node) n2 or the fourth node (the QBB node) n4 to have a high voltage, and outputs a signal in order for the first node (the Q node) n1 or the third node (the QQ node) n3 to have a low voltage, according to the second start pulse signal RVST, the second control pulse signal RCVST, the first clock signal SCLK1, and the second clock signal RCLK1.

The buffer unit 150 includes a pull-up TFT (T15) 151, a pull-down TFT (T16) 152, a first capacitor C1, and a second capacitor C2. Here, the pull-down TFT 152 is configured with a first pull-down TFTs 152A and first and a second pull-down TFT 152B.

The pull-up TFT (T15) 151 has a gate connected to the first node (the Q node) n1, a source that is connected to a driving voltage line to receive a high-level driving voltage GVDD, and a drain connected to an output node OUT.

The pull-up TFT (T15) 151 is turned on according to a voltage of the first node (the Q node) n1 to supply the gate-on voltage level of first clock signal SCLK1 to the output node OUT.

At this time, the first clock signal SCLK1 has a clock type in which the ground voltage and the gate-on voltage level corresponding to one horizontal period (1H) are alternately repeated, and has the same phase as the first start pulse signal SVST.

Here, the pull-up TFT (T15) 151 includes an N-type semiconductor layer formed of oxide. In addition, despite the pull-up TFT (T15) 151 being formed as an N-type transistor, the pull-up TFT (T15) 151 may have a negative threshold voltage due to a characteristic of an oxide semiconductor layer.

The first capacitor C1 may be connected between the gate and source of the pull-up TFT (T15) 151. When the gate-on voltage level of first clock signal SCLK1 is supplied to the output node OUT, the first capacitor C1 increases a voltage of the first node (the Q node) n1 by a voltage level of the first clock signal SCLK1.

Therefore, as shown in FIG. 9, as a gate voltage of the pull-up TFT (T15) 151 is increased by the first capacitor C1, the pull-up TFT (T15) 151 is completely turned on, and quickly supplies the gate-on voltage level of first clock signal SCLK1 to the output node OUT without a voltage being lost by a threshold voltage. The first capacitor C1 may be configured as a parasitic capacitor which is formed in an overlapping area between the gate and source of the pull-up TFT (T15) 151.

The first node (the Q node) n1 has a high-level voltage in synchronization with the first start pulse signal SVST, the first control pulse signal SCVST, and the first clock signal SCLK1, and the pull-up TFT (T15) 151 is turned on by the high-level voltage of the first node (the Q node) n1 to output the high-level driving voltage GVDD to the output terminal OUT.

In the pull-down TFT 152, the first pull-down TFT 152A has a gate connected to the second node (the QB node) n2, a drain connected to the output node OUT, and a source connected to the first low-level driving voltage GVSS supply line.

The first pull-down TFT 152A is turned on according to a voltage of the second node (the QB node) n2 connected to the gate to supply the gate-off voltage level of first low-level driving voltage GVSS to the output node OUT.

When the gate-off voltage level of first low-level driving voltage GVSS is supplied to the second node (QB) n2, the first pull-down TFT 152A is completely turned off, and does not cause a leakage current while the pull-up TFT (T15) 151 supplies the gate-on voltage level of first clock signal SCLK1 to the output node OUT.

In the pull-down TFT 152, the second pull-down TFT 152B has a gate connected to the fourth node (the QBB node) n4, a drain connected to the output node OUT, and a source connected to the first low-level driving voltage GVSS supply line.

As shown in FIG. 9, the first pull-down TFT 152A is turned on according to a voltage of the fourth node (the QBB node) n4 connected to the gate to supply the gate-off voltage level of first low-level driving voltage GVSS to the second node (the QB node) n2.

The first pull-down TFT 152A and the second pull-down TFT 152B includes an N-type semiconductor layer formed of oxide. In addition, despite the first pull-down TFT 152A and the second pull-down TFT 152B being each formed as an N-type transistor, the pull-up TFT (T15) 151 may have a negative threshold voltage due to a characteristic of an oxide semiconductor layer.

When the gate-off voltage level of first low-level driving voltage GVSS is supplied to the second node (QB) n2, the first pull-down TFT 152A is completely turned off, and does not cause a leakage current while the pull-up TFT (T15) 151 supplies the gate-on voltage level of first clock signal SCLK1 to the output node OUT.

The second capacitor C2 may be connected between the gate and source of the first pull-down TFT (T16) 152A. When the gate-on voltage level of second clock signal RCLK1 is supplied to the output node OUT, the second capacitor C2 increases a voltage of the second node (the QB node) n2 by a voltage level of the second clock signal RCLK1.

Therefore, as a gate voltage of the first pull-down TFT (T16) 152A is increased by the second capacitor C2, the first pull-down TFT (T16) 152A is completely turned on, and quickly supplies the gate-on voltage level of second clock signal RCLK1 to the output node OUT without a voltage being lost by a threshold voltage. The second capacitor C1 may be configured as a parasitic capacitor which is formed in an overlapping area between the gate and source of the first pull-down TFT (T16) 152A.

The second node (the QB node) n2 has a high-level voltage in synchronization with the second start pulse signal RVST, the second control pulse signal RCVST, and the second clock signal RCLK1, and the first pull-down TFT (T16) 152A and the second pull-down TFT (T17) 152B are turned on by the high-level voltage of the second node (the QB node) n2 to output the first low-level driving voltage GVSS to the output terminal OUT.

Hereinafter, a method of driving the stage circuit configuring the shift register according to an embodiment of the present invention will be described with reference to FIGS. 10 to 13. FIGS. 10 to 13 are diagrams for describing a method of driving the shift register circuit according to the driving timing of FIGS. 8 and 9.

Figure 10:
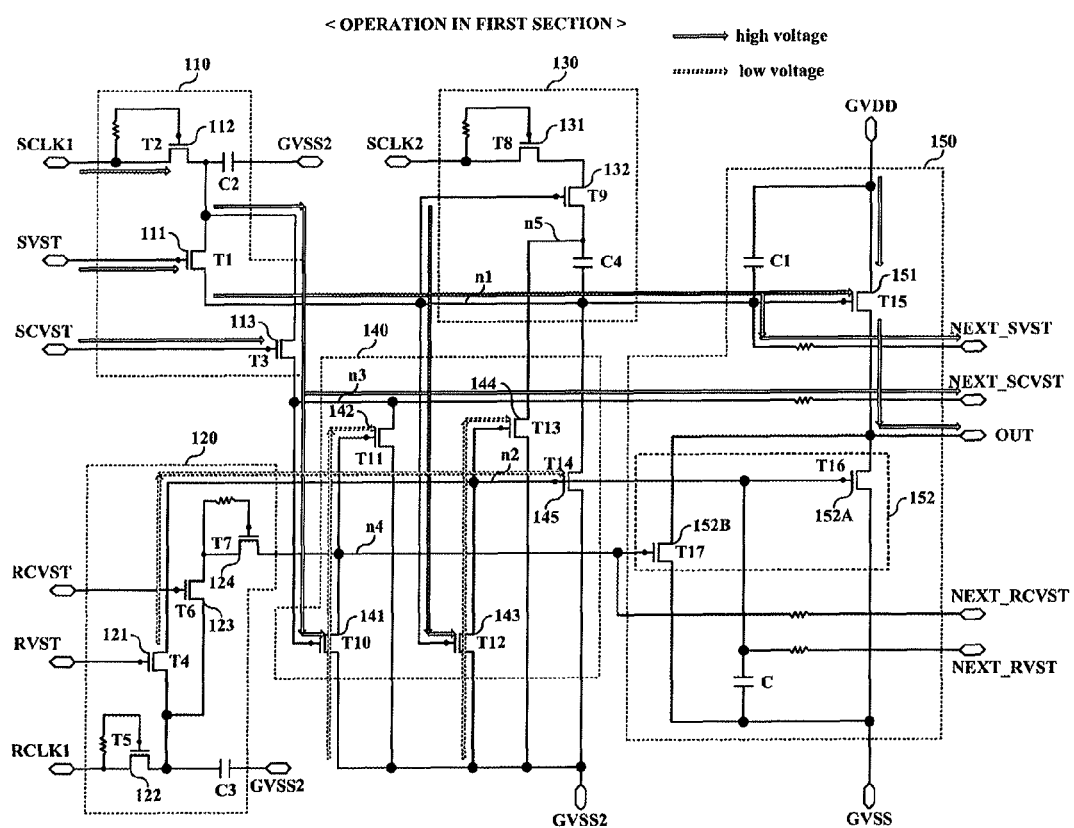
FIGS. 10 to 13 are diagrams for describing a method of driving a shift register circuit according to the driving timing of FIGS. 8 and 9.
Figure 11:
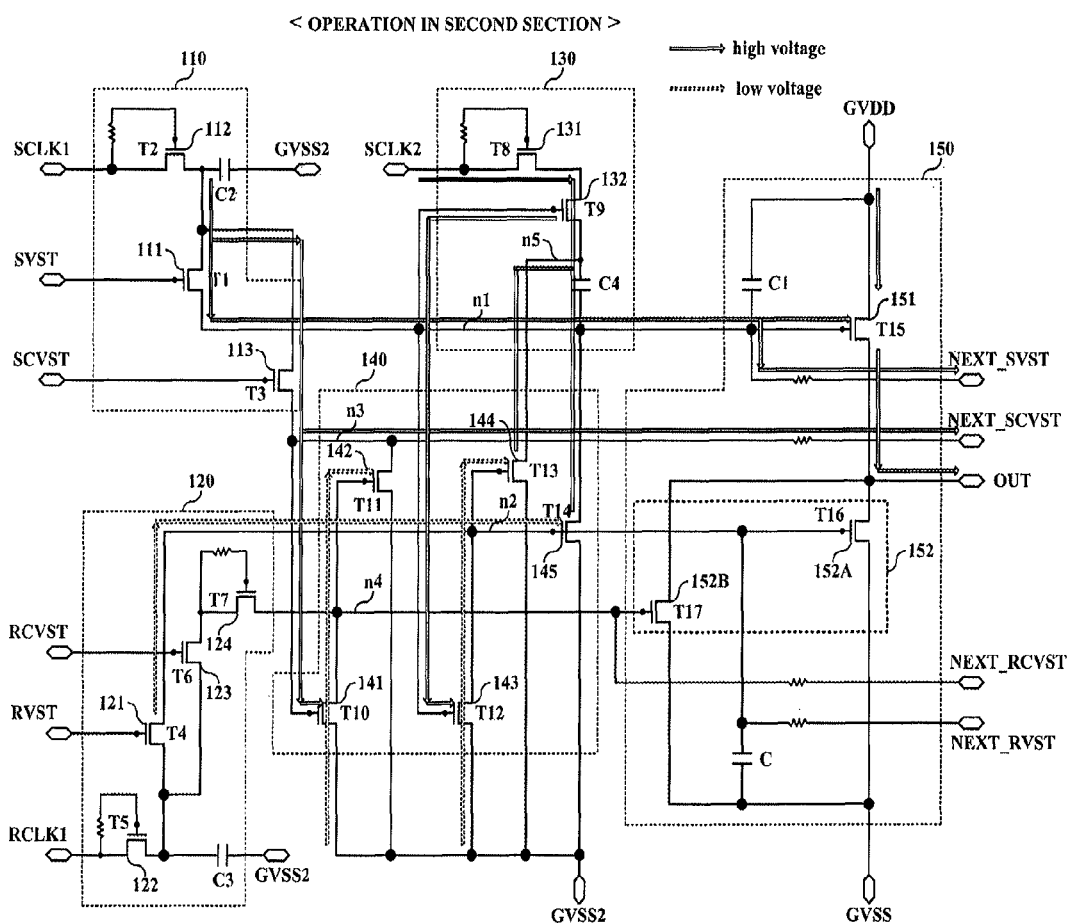
Figure 12:
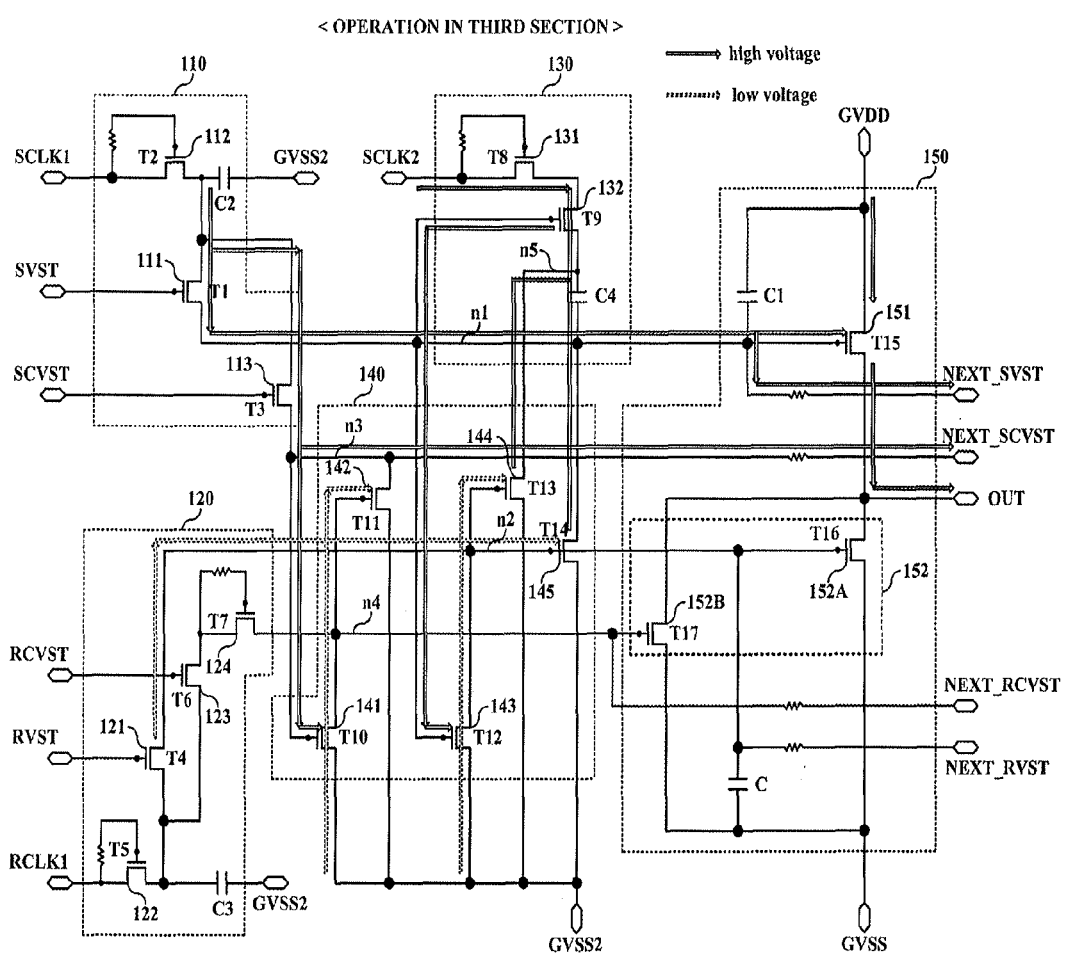
Figure 13:
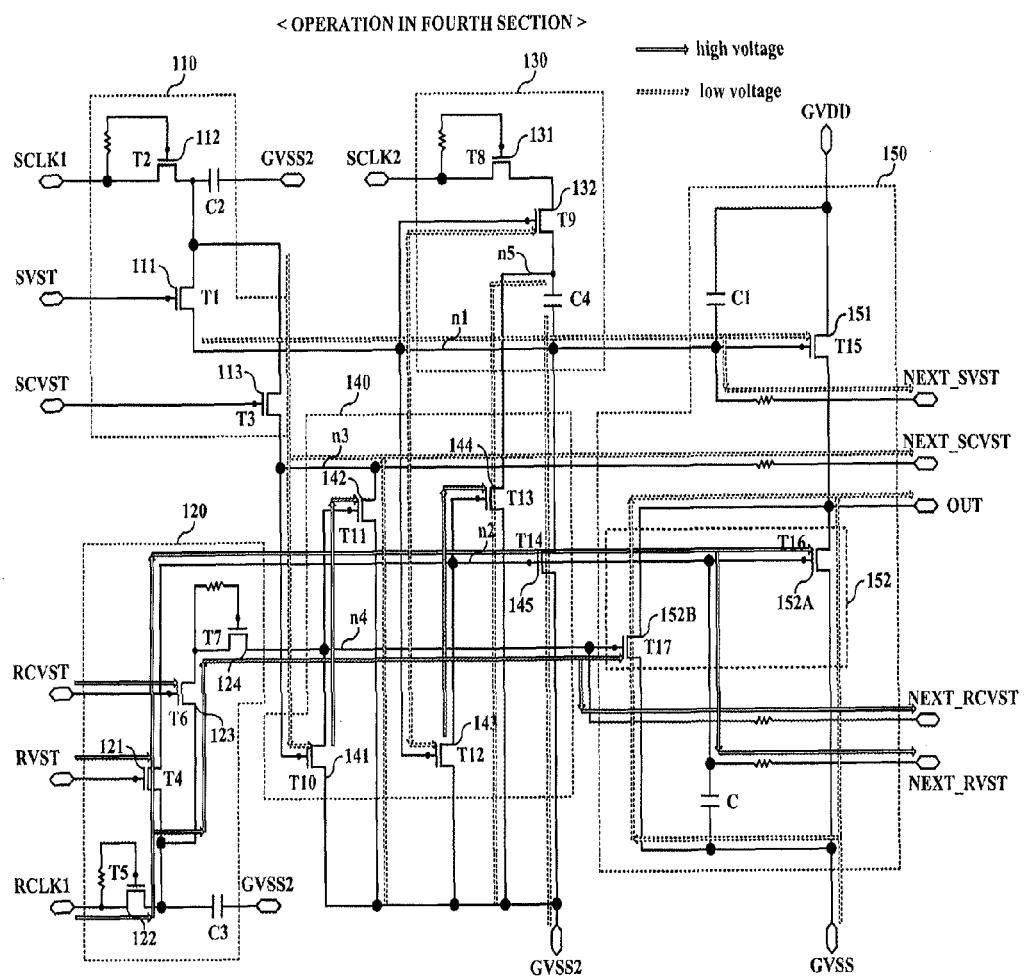

Referring to FIGS. 8 and 10, each of the plurality of stages configuring the shift register 100 according to an embodiment of the present invention generates the multi signals by using the first start pulse signal SVST and the second start pulse signal RVST.

Here, the first start pulse signal SVST allows the output signal to start to rise, and the second start pulse signal RVST allows the output signal to start to fall.

Moreover, each of the plurality of stages configuring the shift register 100 according to an embodiment of the present invention prevents the threshold voltage (Vth) of the pull-down TFT 152 connected to the output terminal OUT from being shifted by using the first start pulse signal SVST and the second start pulse signal RVST.

Referring to FIG. 10, in a first section, the gate-on voltage level of first clock signal SCLK1 is supplied to the first switching TFT (T1) 111 included in the start signal unit 110, and simultaneously the gate-on voltage level of first start pulse signal SVST is supplied to the second switching TFT (T2) 112. At this time, the second start pulse signal RVST is held at the gate-off voltage level.

In this case, the second switching TFT (T2) 112 is turned on by the gate-on voltage level of first start pulse signal SVST, and the gate-on voltage level of first clock signal SCLK1 is supplied to the first node (the Q node) n1. Thus, the voltage of the first node (the Q node) n1 is charged to the gate-on voltage level by the first clock signal SCLK1 which is supplied through the turned-on first switching TFT (T1) 111 and second switching TFT (T2) 112.

Therefore, the pull-up TFT (T15) 151 is turned on with a voltage charged into the first node (Q) n1 to output the high-level driving voltage GVDD to the output terminal OUT. That is, each stage configuring the shift register 100 starts to output a signal according to driving in the first section.

Here, the voltage of the first node (the Q node) n1 is increased to a higher voltage level by bootstrapping of the first capacitor C1, and thus, the pull-up TFT (T15) 151 is completely turned on. Accordingly, the gate-on voltage level of first clock signal SCLK1 is quickly supplied to the output node OUT without a loss.

As described above, the high-level driving voltage GVDD is outputted through the output terminal OUT, and simultaneously the first control pulse signal SCVST is applied to the gate of the third switching TFT (T3) 113, thereby turning on the third switching TFT (T3) 113.

The third switching TFT (T3) 113 is turned on, and the first clock signal SCLK1 turns on the tenth switching TFT (T10) 141 of the setting unit 140. Also, the first switching TFT (T1) 111 is turned on by the first start pulse signal SVST, and the first clock signal SCLK1 applied to the first node (the Q node) n1 turns on the twelfth switching TFT (T12) 143.

The tenth switching TFT (T10) 141 and the twelfth switching TFT (T12) 143 are turned on, and the gate-off voltage level of second low-level driving voltage GVSS2 is supplied to the second node (the QB node) n2. That is, the second node (the QB node) n2 is putted in a low voltage state.

At this time, when the gate-off voltage level of first low-level driving voltage GVSS is supplied to the second node (the QB node) n2, the first pull-down TFT 152A is completely turned off. Thus, the pull-up TFT (T15) 151 does not cause a leakage current while the gate-on voltage level of first clock signal SCLK1 is supplied to the output node OUT.

The first clock signal SCLK1 is applied to the third node (the QQ node) n3, and the first clock signal SCLK1 applied to the third node (the QQ node) n3 is outputted as a first control pulse signal NEXT_SCVST of a next stage.

Moreover, the first clock signal SCLK1 which is applied to the first node (the Q node) n1 via the first switching TFT (T1) 111 turned on by the first start pulse signal SVST is outputted as the first control pulse signal NEXT_SCVST of the next stage.

Subsequently, in a second section, the third clock signal SCLK2 is applied to the eighth switching TFT (T8) 131 included in the boosting unit 130 to boost the first node (the Q node) n1. Only when the third clock signal SCLK2 is supplied, the eighth switching TFT (T8) 131 is turned on, and boots the first node (the Q node) n1 in order for the first node (the Q node) n1 to hold a high level.

Subsequently, in a third section, the pull-up TFT (T15) 151 maintains a turn-on state until before the second start pulse signal RVST is applied to the end signal unit 120, and maintains the high-level driving voltage GVDD at the output terminal OUT.

Subsequently, in a fourth section, as the second start pulse signal RVST, the second control pulse signal RCVST, and the second clock signal RCLK1 are synchronized with each other, the second node (the QB node) n2 and the fourth node (the QBB node) n4 are putted in a high level state, and the first pull-down TFT 152A and the second pull-down TFT 152B are turned on, whereby the first low-level driving voltage GVSS is outputted through the output terminal OUT.

Specifically, the first pull-down TFT 152A is turned on according to the voltage of the fourth node (the QBB node) n4 connected to the gate, and the gate-off voltage level of first low-level driving voltage GVSS is supplied to the second node (the QB node) n2.

The first pull-down TFT 152A is turned on according to the voltage of the second node (the QB node) n2 connected to the gate, and the gate-off voltage level of first low-level driving voltage GVSS is outputted to the output node OUT.

At this time, when the gate-on voltage level of second clock signal RCLK1 is supplied to the output node OUT, the second capacitor C2 increases the voltage of the second node (the QB node) n2 by the voltage level of the second clock signal RCLK1.

Therefore, as the gate voltage of the first pull-down TFT (T16) 152A is increased by the second capacitor C2, the first pull-down TFT (T16) 152A is completely turned on, and quickly supplies the gate-on voltage level of second clock signal RCLK1 to the output node OUT without a voltage being lost by the threshold voltage.

As the second start pulse signal RVST, the second control pulse signal RCVST, and the second clock signal RCLK1 are synchronized with each other, the second node (the QB node) n2 is putted in a high level state, and the first pull-down TFT (T16) 152A and the second pull-down TFT (T17) 152B are turned on with the high voltage of the second node (the QB node) n2, whereby the first low-level driving voltage GVSS is outputted through the output terminal OUT.

At this time, as the voltage level of the first node (the Q node) n1 is changed to the gate-off voltage level, the pull-up TFT (T15) 151 is turned off, the voltage level of the output node OUT is changed to the gate-off voltage level of the low-level voltage GVSS.

As the fourth switching TFT (T4) 121 is turned on by the second start pulse signal RVST supplied to the end signal unit 120, the second clock signal RCLK1 is applied to the second node (the QB node) n2, and the second clock signal RCLK1 applied to the second node (the QB node) n2 is outputted as a second control pulse signal NEXT RVST of a next stage.

Moreover, the fifth switching TFT (T5) 122 is turned on by the second clock signal RCLK1 supplied to the end signal unit 120, and the sixth switching TFT (T6) 123 and the seventh switching TFT (T7) 124 are turned on by the second control pulse signal RCVST, whereby the second clock signal RCLK1 is applied to the fourth node (the QBB node) n4. Thus, the second clock signal RCLK1 applied to the fourth node (the QBB node) n4 is outputted as a first control pulse signal NEXT_SCVST of a next stage.

The shift register 100 including the stages according to the present invention can sequentially supply the gate pulse, which is the gate-on voltage level of clock signal whose a phase is delayed for a time corresponding to ½ horizontal period or one horizontal period, to the pixel circuits of an OLED panel according to an operation of the stages.

The shift register 100 according to an embodiment of the present invention can generate the multi signals applicable to drive various pixels by using the two start pulse signals SVST and RVST.

Moreover, the pull-down TFT is configured with the two switching TFTs, and a node connected to the pull-down TFT has a low voltage, thus preventing the threshold voltage (Vth) of the pull-down TFT from being shifted.

The shift register 100 according to an embodiment of the present invention can generate output signals as multi signals even without adding a line of a layout, and extend a time for which the output signals are outputted.

As described above, the shift register according to the embodiments of the present invention can generate the multi signals applicable to drive the various pixels.

Moreover, the shift register according to the embodiments of the present invention can prevent or improve the shift of the threshold voltage of the oxide TFTs configuring the GIP type shift register.

Moreover, the shift register according to the embodiments of the present invention can generate the output signals as the multi signals even without adding a line of a layout.

Moreover, the shift register according to the embodiments of the present invention can increase an output time of a signal.

Moreover, the shift register according to the embodiments of the present invention is built into the substrate in the GIP type, thus reducing the manufacturing cost of display devices.

In addition to the aforesaid features and effects of the present invention, other features and effects of the present invention can be newly construed from the embodiments of the present invention.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A shift register for driving a pixel circuit of a display device comprising:
   a start signal unit configured to control a start of an output signal by using a first start pulse signal, a first clock signal, and a first control pulse signal which are inputted thereto;
   an end signal unit configured to control an end of the output signal by using a second start pulse signal, a second clock signal, and a second control pulse signal which are inputted thereto;
   a plurality of stages configured to increase the output signal to a high-level driving voltage according to a signal supplied from a first node connected to the start signal unit, and decrease the output signal to a low-level driving voltage according to a signal supplied from a second node connected to the end signal unit, each of the plurality of stages generating multi signals for driving the pixel circuit of the display device; and
   a boosting unit configured to boost the output signal to hold a constant voltage by using a third clock signal inputted thereto.

2. The shift register of claim 1, wherein,
   the start signal unit comprises a plurality of thin film transistors (TFTs) and one capacitor, the start signal unit increases the output signal by using the first start pulse signal and the first clock signal, and the start signal unit shifts a signal of each of the first node and a third node to which a high signal is outputted.

3. The shift register of claim 2, wherein, the end signal unit comprises a plurality of TFTs and one capacitor, the end signal unit drops the output signal, and the end signal unit shifts a signal of each of the second node and a fourth node to which a low signal is outputted.

4. The shift register of claim 3, further comprising an output buffer, wherein the output buffer comprises:

a pull-up TFT configured to output an output signal corresponding to the high-level driving voltage; and a pull-down TFT configured to output an output signal corresponding to the low-level driving voltage, and configured with a first pull-down TFT and a second pull-down TFT, the first pull-down TFT being turned on by a signal of the second node to output the output signal as the low-level driving voltage, and the second pull-down TFT being turned on by a signal of the fourth node to output the output signal as the low-level driving voltage.

5. The shift register of claim 3, wherein, a first output signal is generated by using the first start pulse signal and the second start pulse signal, and after a certain delay time elapses, a second output signal is generated by again generating the first start pulse signal and the second start pulse signal, and the first output signal and the second output signal have different output times.

6. The shift register of claim 3, wherein the start signal unit comprises:

a first switching TFT configured to turn on according to the first start pulse signal to supply the first clock signal inputted thereto to the first node;

a second switching TFT configured to have a diode-connection, and supply the first clock signal inputted thereto to a source of the first switching TFT; and a third switching TFT configured to have a gate receiving the first control pulse signal, a source connected between a drain of the second switching TFT and the source of the first switching TFT, and a drain connected to the third node.

7. The shift register of claim 6, wherein only when the first start pulse signal having a gate-on voltage level is supplied, the first switching TFT of the start signal unit is turned on to output the first clock signal having the gate-on voltage level to the first node.

8. The shift register of claim 6, wherein only when the first control pulse signal having a gate-on voltage level is supplied, the third switching TFT of the start signal unit is turned on to output the first clock signal having the gate-on voltage level to the third node.

9. The shift register of claim 3, wherein the end signal unit comprises:

a fourth switching TFT configured to turn on according to the second start pulse signal applied to a gate thereof to supply the second clock signal applied to a source thereof to the second node;

a fifth switching TFT configured to have a diode-connection, and supply the second clock signal inputted thereto to the source of the fourth switching TFT;

a sixth switching TFT configured to have a gate receiving the second control pulse signal, a source connected between a drain of the fifth switching TFT and the source of the fourth switching TFT, and a drain connected to the fourth node; and a seventh switching TFT diode-connected between the drain of the sixth switching TFT and the fourth node, and configured to supply the second clock signal to the fourth node when the sixth switching TFT is turned on.

10. The shift register of claim 9, wherein only when the second start pulse signal having a gate-on voltage level is supplied, the fourth switching TFT of the end signal unit is turned on to output the second clock signal having the gate-on voltage level to the second node.

11. The shift register of claim 9, wherein only when the second control pulse signal having a gate-on voltage level is supplied, the sixth switching TFT of the end signal unit is turned on to output the second clock signal having the gate-on voltage level to the fourth node.

12. The shift register of claim 1, further comprising a setting unit configured to allow a voltage applied to the first node to become the high-level driving voltage or the low-level driving voltage, and allow a voltage applied to the second node to become the high-level driving voltage or the low-level driving voltage.

13. The shift register of claim 12, wherein, when a voltage applied to the first node or the third node is the high-level driving voltage, the setting unit allows a voltage of the second node or fourth node to become the low-level driving voltage, and when a voltage applied to the first node or the third node is the low-level driving voltage, the setting unit allows the voltage of the second node or fourth node to become the high-level driving voltage.

14. A display device comprising:

A plurality of pixels disposed in a display panel;

A organic light emitting diode (OLED) disposed the each of the plurality of pixels;

A pixel circuit for driving the OLED; and

A shift register for driving the pixel circuit, wherein the shift register comprises:

a start signal unit configured to control a start of an output signal by using a first start pulse signal, a first clock signal, and a first control pulse signal which are inputted thereto;

an end signal unit configured to control an end of the output signal by using a second start pulse signal, a second clock signal, and a second control pulse signal which are inputted thereto;

a plurality of stages configured to increase the output signal to a high-level driving voltage according to a signal supplied from a first node connected to the start signal unit, and decrease the output signal to a low-level driving voltage according to a signal supplied from a second node connected to the end signal unit, each of the plurality of stages generating multi signals for driving the pixel circuit of the display device; and a boosting unit configured to boost the output signal to hold a constant voltage by using a third clock signal inputted thereto.

15. The display device of claim 14, wherein, the start signal unit comprises a plurality of thin film transistors (TFTs) and one capacitor, the start signal unit increases the output signal by using the first start pulse signal and the first clock signal, and the start signal unit shifts a signal of each of the first node and a third node to which a high signal is outputted.

16. The display device of claim 15, wherein, the end signal unit comprises a plurality of TFTs and one capacitor, the end signal unit drops the output signal, and the end signal unit shifts a signal of each of the second node and a fourth node to which a low signal is outputted.

17. The display device of claim 16, further comprising a output buffer, wherein the output buffer comprises:

a pull-up TFT configured to output an output signal corresponding to the high-level driving voltage; and a pull-down TFT configured to output an output signal corresponding to the low-level driving voltage, and configured with a first pull-down TFT and a second pull-down TFT, the first pull-down TFT being turned on by a signal of the second node to output the output signal as the low-level driving voltage, and the second pull-down TFT being turned on by a signal of the fourth node to output the output signal as the low-level driving voltage.

18. The display device of claim 17, further comprising a setting unit configured to allow a voltage applied to the first node to become the high-level driving voltage or the low-level driving voltage, and allow a voltage applied to the second node to become the high-level driving voltage or the low-level driving voltage.

19. The display device of claim 18, wherein, when a voltage applied to the first node or the third node is the high-level driving voltage, the setting unit allows a voltage of the second node or fourth node to become the low-level driving voltage, and when a voltage applied to the first node or the third node is the low-level driving voltage, the setting unit allows the voltage of the second node or fourth node to become the high-level driving voltage.

* * * * *